United States Patent [19]

Takatsu

[11] Patent Number: 5,260,609
[45] Date of Patent: Nov. 9, 1993

[54] LOGIC CIRCUIT UISING TRANSISTOR HAVING NEGATIVE DIFFERENTIAL CONDUCTANCE

[75] Inventor: Motomu Takatsu, Hadano, Japan

[73] Assignee: Fujitsu Limited, Kawasaki, Japan

[21] Appl. No.: 945,591

[22] Filed: Sep. 16, 1992

Related U.S. Application Data

[63] Continuation of Ser. No. 647,476, Nov. 29, 1990, abandoned.

[30] Foreign Application Priority Data

Nov. 29, 1989 [JP] Japan ................... 1-309707

[51] Int. Cl.[5] .................. H03K 19/013; H03K 4/787
[52] U.S. Cl. ................... 307/454; 307/322; 307/471
[58] Field of Search ........... 307/454, 471, 472, 299.1, 307/322

[56] References Cited

U.S. PATENT DOCUMENTS

| | | | |
|---|---|---|---|
| 3,230,387 | 1/1966 | Gruodis et al. | 307/471 |
| 4,849,934 | 7/1989 | Yokoyama et al. | 307/322 |
| 4,868,415 | 9/1989 | Imamura et al. | 307/322 |

FOREIGN PATENT DOCUMENTS 130561 6/1987 Japan .
934306 11/1961 United Kingdom .

OTHER PUBLICATIONS

M. Suzuki et al., "Gate Arrays", 1988 IEEE International Solid-State Circuits Conference, ISSCC 88, Wednesday, Feb. 17, 1988, pp. 70-71.

N. Yokoyama et al., "A New Functional, Resonant-Tunnelling Hot Electron Transistor (RHET)", Japanese Journal of Applied Physics, vol. 24, No. 11, Nov. 1985, pp. L853-L854.

T. Futatsugi et al., "A Resonant-Tunnelling Bipolar Transistor (RBT)-A New Functional Device with High Current Gain", Japanese Journal of Applied physics, vol. 26, No. 2, Feb. 1987, pp. L131-L133.

M. Shur, et al., "New Negative Resistance Regime of Heterostructure Insulated Gate Transistor (HIGFET) Operation", IEEE Electron Device Letters, vol. EDL-7, No. 2, Feb. 1986, pp. 78-80.

*Primary Examiner*—Edward P. Westin
*Assistant Examiner*—Andrew Sanders
*Attorney, Agent, or Firm*—Staas & Halsey

[57] ABSTRACT

A logic circuit first, second and third input terminals, an output terminal, a load resistance element, and a transistor having a negative differential conductance. The collector is connected to the output terminal and coupled to a first power source via the load resistance element. The emitter is connected to a second power source. First, second and third resistors are connected between the base of the transistor and the first, second and third input terminals, respectively. A fourth resistor is connected between the base and emitter of the transistor. The resistance values of the first, second, third and fourth resistors are selected so that the transistor has first and second operating points respectively obtained when all the first, second and third input terminals are at a low level and when two of the first, second and third input terminals are at a high level, and has third and fourth operating points respectively obtained when one of the first, second and third input terminals is at the high level and when all the first, second and third input terminals are at the high level. A collector current obtained at the first and second operating points is less than that obtained at the third and fourth operating points.

12 Claims, 6 Drawing Sheets

LOGIC CIRCUIT UISING TRANSISTOR HAVING NEGATIVE DIFFERENTIAL CONDUCTANCE

This application is a continuation of application Ser. No. 07/647,476, filed Nov. 29, 1990, now abandoned.

BACKGROUND OF THE INVENTION

The present invention generally relates to a logic circuit using a transistor having a negative differential conductance, and more particularly to a three-input exclusive-OR or exclusive-NOR circuit using a transistor having a negative differential conductance.

As is well known, an exclusive-OR circuit is used for configuring an adder circuit. A two-input exclusive-OR circuit generates a low-level output signal when both the two input signals have an identical level, and generates a high-level output signal when both the two input signals have different levels. There is also known a three-input exclusive-OR circuit, which generates a low-level output signal when an even number of input signals (including zero) which are at a high level is applied thereto, and generates a high-level output signal when an odd number of input signals which are at the high level is applied thereto. The output signal of such a three-input exclusive-OR circuit corresponds to the result of an addition (sum) operation on binary values including a carry bit. Thus, a three-input exclusive-OR circuit is used for configuring a full adder.

The operation of the three-input exclusive-OR circuit is written as follows:

$$Q = A \oplus B \oplus C \quad (1)$$
$$= \overline{A}\overline{B}C + \overline{A}B\overline{C} + A\overline{B}\overline{C} + ABC$$

where A, B and C are respectively the input signals to the three-input exclusive-OR circuit, and Q is the output signal thereof. The three-input exclusive-OR circuit can be configured by a combination of gates realizing the equation (1).

FIG. 1 is a circuit diagram of a conventional three-input exclusive-OR circuit which employs emitter-coupled logic (ECL) circuits (see M. Suzuki et al., "GATE ARRAYS", 1988 IEEE International Solid-State Circuits Conference, ISSCC 88, Wednesday, Feb. 17, 1988, pp. 70–71). In FIG. 1, S indicates the sum of the three inputs including the carry bit, and $\overline{A}$, $\overline{B}$, $\overline{C}$ and $\overline{S}$ are the inverted versions of A, B, C and S, respectively.

However, the configuration shown in FIG. 1 needs a large number of transistors, and cannot realize a high integration density.

On the other hand, there is known a two-input exclusive-NOR circuit using a transistor having a negative differential conductance (see N. Yokoyama et al., "A NEW FUNCTIONAL, RESONANT-TUNNELING HOT ELECTRON TRANSISTOR (RHET)", Japanese Journal of Applied Physics, Vol. 24, No. 11, November, 1985, pp. L853–L854).

FIG. 2 is a circuit diagram of a two-input exclusive-NOR circuit proposed in the above-mentioned document. A transistor Tr is formed of an RHET. The input signal A is applied to the base of the transistor Tr via a resistor R1, and the input signal B is applied to the base of the transistor Tr via a resistor R2. The emitter of the transistor Tr is directly grounded. The collector of the transistor Tr is coupled to a power source via a resistor R3. The output signal Q of the two-input exclusive-NOR circuit is obtained at the collector of the transistor.

However, in order to realize the three-input exclusive-NOR circuit, it is necessary to use two two-input exclusive-NOR circuits connected in series. The use of such a two-input exclusive-NOR circuit needs a reduced number of transistors necessary to realize the three-input exclusive-NOR circuit.

SUMMARY OF THE INVENTION

It is a primary object of the present invention to provide a three-input exclusive-NOR (or exclusive-OR) circuit using a single transistor having a negative differential conductance.

The above object of the present invention is achieved by a logic circuit comprising:
first, second and third input terminals,
an output terminal;
a load resistance element;
a transistor having an emitter, a base and a collector and having a negative differential conductance, the collector being connected to the output terminal and coupled to a first power source via the load resistance element, and the emitter being connected to a second power source;
a first resistance element connected between the first input terminal and the base of the transistor;
a second resistance element connected between the second input terminal and the base of the transistor;
a third resistance element connected between the third input terminal and the base of the transistor; and
a fourth resistance element connected between the base and emitter of the transistor,
wherein resistance values of the first, second, third and fourth resistance elements are selected so that the transistor has first and second operating points respectively obtained when all the first, second and third input terminals are at a low level and when two of the first, second and third input terminals are at a high level, and has third and fourth operating points respectively obtained when one of the first, second and third input terminals is at the high level and when all the first, second and third input terminals are at the high level, and
wherein a collector current obtained at the first and second operating points is less than that obtained at the third and fourth operating points.

The above-mentioned object of the present invention a logic circuit comprising:
first, second and third input terminals,
an output terminal;
a load resistance element;
an active element having a negative differential conductance and having first and second terminals, the output terminal being coupled to the the active element;
a first resistance element connected between the first input terminal and the first terminal of the active element;
a second resistance element connected between the second input terminal and the first terminal of the active element;
a third resistance element connected between the third input terminal and the first terminal of the active element,
wherein resistance values of the first, second and third resistance elements are selected so that the active element has first and second operating points respectively obtained when all the first, second and third input terminals are at a low level and when two of the first, second and third input terminals are at a high level, and has third and fourth operating points respectively obtained when one of the first, second and third input terminals is at the high level and when all the first, second and third input terminals are at the high level, and wherein a current passing through the active element and obtained at the first and second operating points is less than that obtained at the third and fourth operating points.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of a preferred embodiment of the present invention with reference to FIG. 3. As shown, a three-input exclusive-NOR circuit according to the preferred embodiment of the present invention is composed of a transistor Tr1, and five resistors Ri1, Ri2, Ri3, $R_B$ and $R_L$. Input terminals In1, In2 and In3 are coupled to the base of the transistor Tr1 via resistors Ri3, Ri2 and Ri1, respectively. The resistor $R_B$ is connected between the base of the transistor Tr1 and a low-potential side power source $V_{EE}$. The emitter of the transistor Tr1 directly connected to the power source $V_{EE}$. The collector of the transistor Tr1 is coupled to a high-potential side power source $V_{CC}$ via the load resistor $R_L$, and directly connected to an output terminal Out of the three-input exclusive-NOR circuit.

Figure 4:
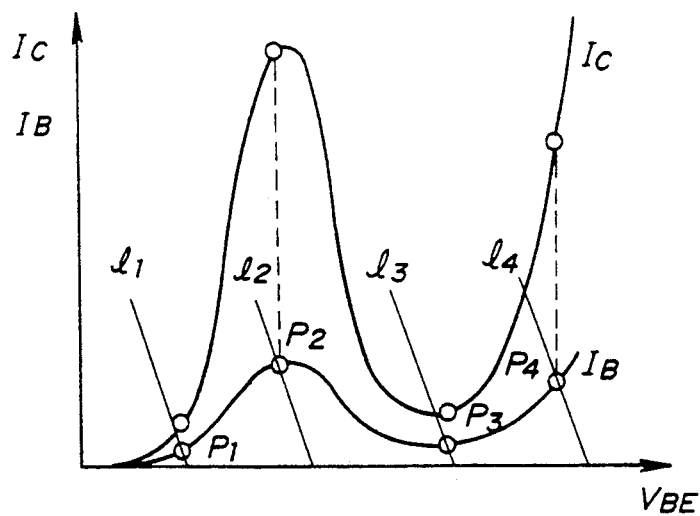
FIG. 4 is a graph illustrating the operation of the circuit shown in FIG. 3.

The transistor Tr1 is formed of a transistor having a negative differential conductance as shown in FIG. 4. For example, the transistor Tr1 is formed of an RHET having a resonance tunneling barrier provided between the base and emitter thereof. FIG. 4 illustrates changes of the base current $I_B$ and collector current $I_C$ of the transistor Tr1 as a function of the base-emitter voltage $V_{BE}$ thereof. That is, FIG. 4 illustrates an $I_B$-$V_{BE}$ characteristic and an $I_C$-$V_{BE}$ characteristic. As shown in FIG. 4, the transistor Tr1 has a negative differential conductance in which the base current $I_B$ and the collector current $I_C$ decrease as the base-emitter voltage $V_{BE}$ increases.

As shown in FIG. 4, four load lines $l_1$, $l_2$, $l_3$ and $l_4$ are drawn on the graph of the $I_B$-$V_{BE}$ and $I_C$-$V_{BE}$ characteristics. The load lines $l_1$, $l_2$, $l_3$ and $l_4$ are based on voltages V1, V2 and V3 of the input terminals In1, In2 and In3 (voltages of the input signals A, B and C) as well as the resistance values of the resistors Ri1, Ri2, Ri3 and Ri4. Cross points P1, P2, P3 and P4 where the load lines $l_1$, $l_2$, $l_3$ and $l_4$ cross the $I_B$ curve indicate the values of the base current $I_B$ obtained when the transistor Tr1 operates along the load lines $l_1$, $l_2$, $l_3$ and $l_4$. Cross points where the $I_C$ curve crosses perpendicular lines (illustrated by the broken lines) respectively extending from the cross points P1, P2, P3 and P4 indicate the values of the collector current $I_C$ obtained when the transistor Tr1 operates along the load lines $l_1$, $l_2$, $l_3$ and $l_4$.

The resistance values of the resistors Ri1, Ri2, Ri3 and $R_B$ are determined as follows. When the voltages V1, V2 and V3 of the input signals A, B and C are at the low level, the transistor Tr1 operates at the operating point P1. When any one of the voltages V1, V2 and V3 of the input signals A, B and C is at the high level, the transistor Tr1 operates at the operating point P2. When any two of the voltages V1, V2 and V3 of the input signals A, B and C are at the high level, the transistor Tr1 operates at the operating point P3. When the voltages V1, V2 and V3 of the input signals A, B and C are all at the high level, the transistor Tr1 operates at the operating point P4. The operating point P1 is located at a position at which the base-emitter voltage $V_{BE}$ is approximately equal to a current-rise voltage at which the collector current $I_C$ starts to rise. The operating point P2 is located at a position where the collector current $I_C$ is approximately equal to a peak value. The operating point P3 is located at a position where the collector current $I_C$ is approximately equal to a valley value. The operating point P4 is located at a rising portion of the $I_C$ curve appearing after the valley of the $I_C$ curve. At this rise portion, the collector current $I_C$ is approximately equal to the peak value obtained at the operating point P2.

When all the voltages V1, V2 and V3 are at the low level, or when two of the voltages V1, V2 and V3 are at the high level, the base current $I_B$ and the collector current $I_C$ are approximately equal to the respective valley values. On the other hand, when one of the voltages V1, V2 and V3 is at the high level, or when all the voltages V1, V2 and V3 are at the high level, the base current $I_B$ and the collector current $I_C$ are approximately equal to the respective peak values. The collector current $I_C$ causes a voltage drop developed across the load resistor $R_L$. Thus, the output signal Q is at a high level when all the voltages V1, V2 and V3 are at the low level, or when two of the voltages V1, V2 and V3 are at the high level. On the other hand, the output signal Q is at a low level when one of the voltages V1, V2 and V3 is at the high level, or when all the voltages V1, V2 and V3 are at the high level.

For example, a current-rise base-emitter voltage $V_{BE}$ obtained at the operating point P1 is equal to about 0.3 V, and a peak base-emitter voltage $V_{BE}$ obtained at the operating point P2 is equal to about 0.6 V. The peak value of the base current $I_B$ obtained at the operating point P2 is equal to about 4 mA. A valley base-emitter voltage $V_{BE}$ obtained at the operating point P3 is equal to about 1.0 V. In this case, the difference between the peak voltage and the current-rise base-emitter voltage $V_{BE}$ is equal to 0.3 V (=0.6 V-0.3 V), and the difference between the valley voltage and the peak voltage is equal to 0.4V (1.0 V-0.6 V). Thus, the rise voltage, the peak voltage and the valley voltage are arranged at almost identical intervals.

Figure 2:
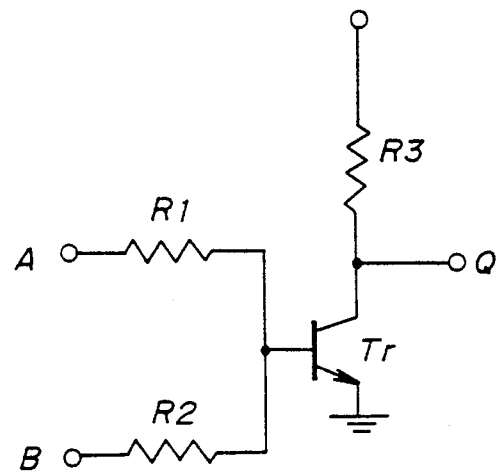
FIG. 2 is a circuit diagram of a conventional two-input exclusive-NOR circuit formed of a transistor having a negative differential conductance.

The base-emitter voltage $V_{BE}$ corresponds to a voltage drop developed across the resistor $R_B$. When $I_B=0$, cross points where the transverse line of the graph of FIG. 2 crosses the load lines $l_1$, $l_2$, $l_3$ and $l_4$ are based on the input voltages V1, V2 and V3 as well as the resistors Ri1, Ri2, Ri3 and $R_B$. In this case, the resistance values of the Ri1, Ri2 and Ri3 are equal to each other, for example. It is now assumed that the resistance value of each of the resistors Ri1, Ri2 and Ri3 is indicated by Ri. On the other hand, when $I_B \neq 0$, the base current $I_B$ passes through at least one of the resistors Ri1, Ri2 and Ri3. Thus, the voltage drop developed across the resistor $R_B$ (divided voltage) decreases. Thus, the load lines $l_1$, $l_2$, $l_3$ and $l_4$ are inclined. That is, the slopes of the load lines $l_1$, $l_2$, $l_3$ and $l_4$ are determined based on the parallel resistance of the resistors Ri1, Ri2, Ri3 and $R_B$. When the resistors Ri1, Ri2 and Ri3 have an identical small resistance value, the slopes of the load lines $l_1$, $l_2$, $l_3$ and $l_4$ are great. On the other hand, when the resistors Ri1, Ri2 and Ri3 have an identical large resistance, the slopes of the load lines $l_1$, $l_2$, $l_3$ and $l_4$ are small. If the slopes of the load lines $l_3$, $l_2$, $l_3$ and $l_4$ are excessively great, it is necessary for a circuit of the previous stage connected on the input side thereof to have a large drivability. On the other hand, if the slopes of the load lines $l_1$, $l_2$, $l_3$ and $l_4$ are excessively small, one load line will cross the $I_B$ curve at a plurality of points. It is considered that the transistor Tr1 is voltage-driven and the base-emitter voltage $V_{BE}$ is approximately equal to a voltage obtained by dividing the average of the signals A, B and C by the ratio of Ri/3 and $R_B$ when the parallel resistance of the resistors Ri1, Ri2, Ri3 and $R_B$ is small with respect to the input resistance of the transistor Tr1. According to the device characteristics, the circuit is designed so that $R_B > Ri$ or $R_B < Ri$.

The input signals A, B and C correspond to the output signals Q of the analogous logic circuits of the previous stage. Thus, the high level of the output signal Q is equal to a potential $V_H$ obtained by multiplying the value of the collector current $I_C$ obtained at the operation points P1 or P3 by the resistance value $R_L$ and subtracting the multiplication result from the power source voltage $V_{CC}$. On the other hand, the low level of the output signal Q is equal to a potential $V_L$ obtained by multiplying the value of the collector current $I_C$ obtained at the operating points P2 or p4 by the resistance value $R_L$ and subtracting the multiplication result from the power source voltage $V_{CC}$.

Assuming that $V_{CC}=2.5$ V, $V_{EE}=V$, $V_H=1.8$V, $V_L=0.6$ V, and Ri=$R_B$, the following base-emitter voltages $V_{BE}$ are obtained, depending on the levels of the input signals A, B and C. When the input signals A, B and C are at the low level, $V_{BE}=0.6 \times (\frac{3}{4})=0.45$ V. When one of the input signals A, B and C is at the high level and the remaining input signals are at the low level, $V_{BE}=(1.2+1.8)/3 \times (\frac{3}{4})=0.75$ V. When one of the input signals A, B and C is at the low level, and the remaining input signals at the high level, $V_{BE}=(0.6+3.6)/3 \times (\frac{3}{4}) \approx 1.05$ V. When all the input signals A, B and C are at the high level, $V_{BE}=1.35$ V.

Figure 3:
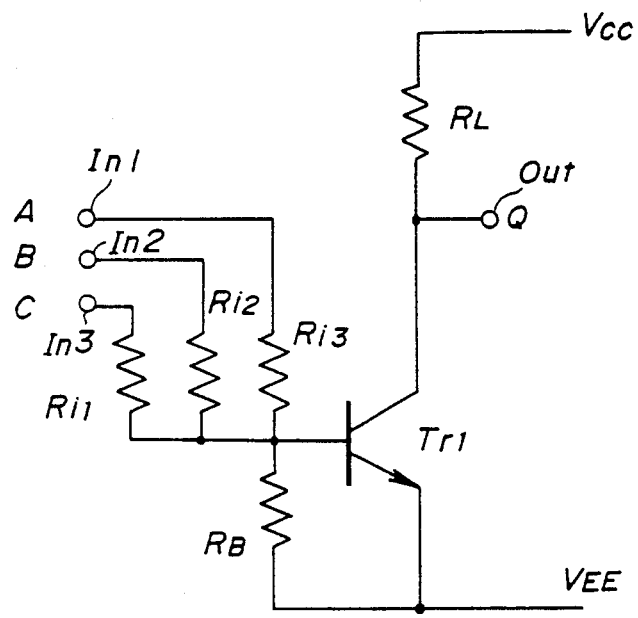
FIG. 3 is a circuit diagram of a three-input exclusive-NOR circuit according to a preferred embodiment of the present invention.

For example, the three-input exclusive-NOR circuit shown in FIG. 3 is designed so that Ri=700 ohms, $R_B=2000$ ohms, and $R_L=2500$ ohms. The low level of the input signal is equal to 0.5 V, and the high level thereof is equal to 1.7 V. The low level of the output signal Q is less than 0.7 V, and the high level thereof is higher than 1.4 V.

It should be appreciated that the present invention uses the rising portion of the collector current $I_C$ appearing after the valley of the $I_C$ curve. It should be further appreciated that the existence of the resistor $R_B$ enhances the degree of freedom to design the load lines $l_1$, $l_2$, $l_3$ and $l_4$, since the slopes thereof are based on the voltage dividing ratio, as has been described previously. In order to realize the three-input exclusive-NOR circuit using a transistor having the negative differential conductance, it is necessary to determine the four operating points P1, P2, P3 and P4, as shown in FIG. 4. From point of view of the operational principle, the resistor $R_B$ is not required. However, unless the resistor $R_B$ is provided, it would be very difficult to determine the four operating points P1, P2, P3 and P4, as shown in FIG. 4.

Figure 5:
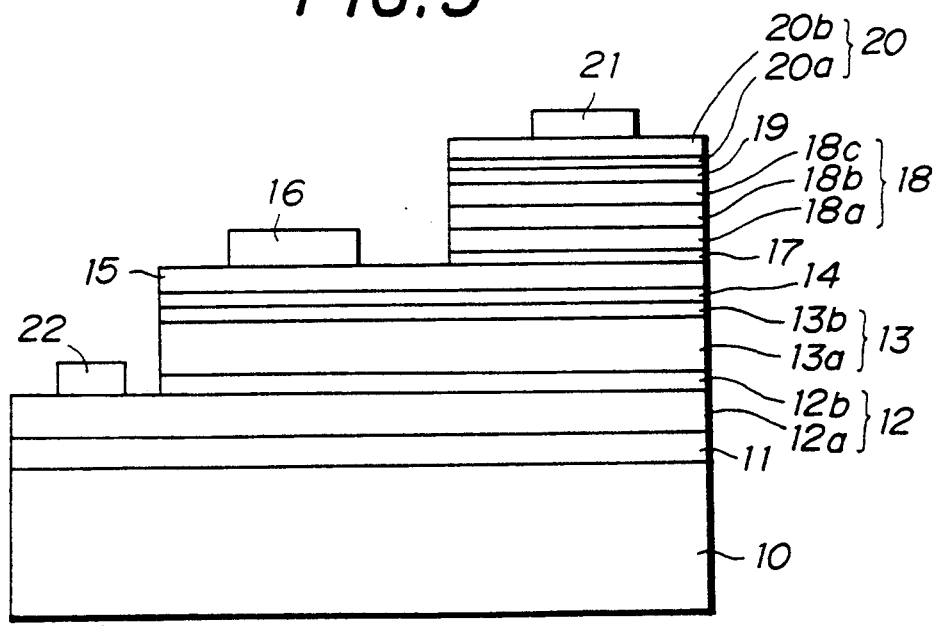
FIG. 5 is a cross-sectional view of a transistor shown in FIG. 3.

FIG. 5 is a cross-sectional view of an RHET functioning as the transistor Tr1. The RHET shown in FIG. 5 is composed of a substrate 10, a buffer layer 11, a collector layer 12 consisting of two layers 12a and 12b, a collector barrier layer 13 consisting of two layers 13a and 13b, a spacer layer 14 and a base layer 15. A base electrode 16 is formed on the base layer 15. Further, on the base layer 15, there are provided a spacer layer 17, a resonance barrier layer 18 consisting of three layers 18a, 18b and 18c, a spacer layer 19 and an emitter layer 20 consisting of two layers 20a and 20b. An emitter electrode 21 is formed on the emitter layer 20, and a collector electrode 22 is formed on the layer 12a. The device condition of the RHET shown in FIG. 5 is shown in Table 1.

TABLE 1

| Layer | | Material | Impurity dose | Thickness |
|---|---|---|---|---|
| 10 | | SI InP | | |
| 11 | | i-In$_{0.52}$Al$_{0.48}$As | | 200 nm |
| 12: | 12a | n-In$_{0.53}$Ga$_{0.47}$As | $5 \times 10^{18}$ cm$^{-3}$ | 300 nm |
| | 12b | n-In$_{0.53}$Ga$_{0.47}$As | $1 \times 10^{18}$ cm$^{-3}$ | 100 nm |
| 13: | 13a | i-In$_{0.53}$Ga$_{0.47}$As | | 300 nm |
| | 13b | i-(In$_{0.53}$Ga$_{0.47}$)$_{0.5}$(In$_{0.52}$Al$_{0.48}$)$_{0.5}$As | | 50 nm |
| 14 | | i-In$_{0.53}$Ga$_{0.47}$As | | 1.5 nm |
| 15 | | n-In$_{0.53}$Ga$_{0.47}$As | $1 \times 10^{18}$ cm$^{-3}$ | 27 nm |
| 17 | | i-In$_{0.53}$Ga$_{0.47}$As | | 15. nm |
| 18: | 18a | i-AlAs | | 2.37 nm |
| | 18b | i-In$_{0.53}$Ga$_{0.47}$As | | 2.93 nm |
| | 18c | i-In$_{0.52}$Al$_{0.48}$As | | 6.45 nm |
| 19 | | i-In$_{0.53}$Ga$_{0.47}$As | | 1.5 nm |
| 20: | 20a | n-In$_{0.53}$Ga$_{0.47}$As | $1 \times 10^{18}$ cm$^{-3}$ | 50 nm |
| | 20b | n-In$_{0.53}$Ga$_{0.47}$As | $5 \times 10^{19}$ cm$^{-3}$ | 150 nm |

The peak value of the collector current $I_C$ is approximately equal to 1 mA when the emitter size is 2 $\mu$m $\times$ 5 $\mu$m, and approximately equal to 4 mA when the emitter size is 2 $\mu$m and 20 $\mu$m. The peak base-emitter voltage $V_{BE}$ is approximately equal to 0.7 V, and the valley base-emitter voltage $V_{BE}$ is approximately equal to 1.2 V. In this case, the collector-emitter breakdown voltage is approximately equal to 2.7 V.

Figure 6:
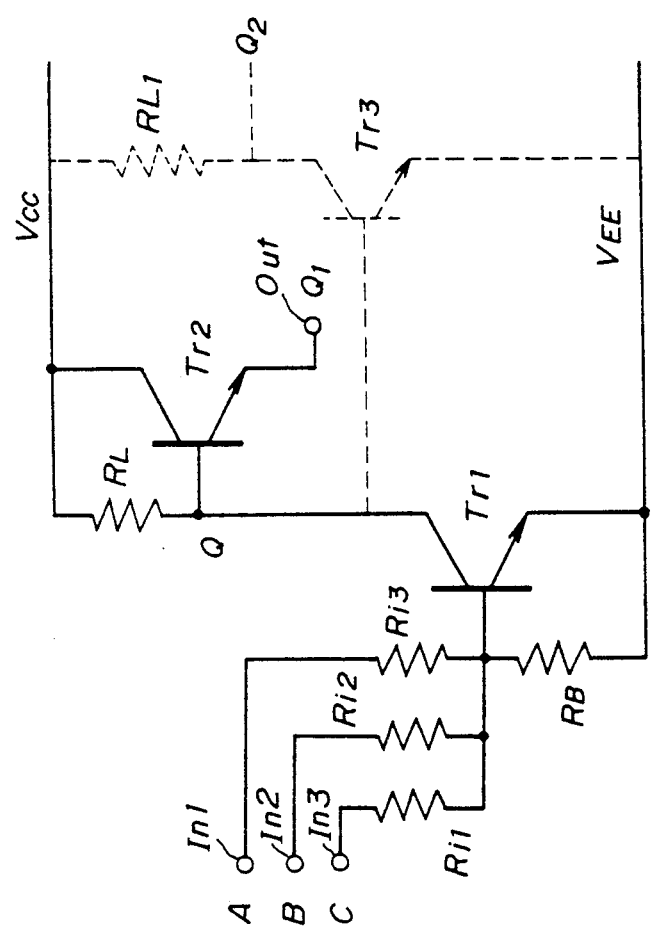
FIG. 6 is a circuit diagram of a variation of the circuit shown in FIG. 3.

Referring to FIG. 6, there is illustrated a variation of the three-input exclusive-NOR circuit shown in FIG. 3. In FIG. 6, those parts which are the same as those shown in FIG. 3 are given the same reference numerals. An emitter follower transistor Tr2 is coupled to the collector of the transistor Tr1. More specifically, the base of the transistor Tr2 is connected to the collector of the transistor Tr1. The load resistor $R_L$ is connected between the base and the collector of the transistor Tr2. The collector of the transistor Tr2 is connected to the power source $V_{CC}$, and the emitter thereof is connected to the output terminal Out. The emitter follower transistor Tr2 is provided for enhancing drivability of the three-input exclusive-NOR circuit. It is preferable that the transistor Tr2 be formed of a transistor having a type identical to that of the transistor Tr1 from the point of view of the production process. For example, when the transistor Tr1 is formed of an RHET, the transistor Tr2 is also formed of an RHET. The current-rise voltage, the peak voltage and the valley voltage of the transistor Tr2 are designed to be the same as those of the transistor Tr1. The peak collector current of the transistor Tr2 is approximately four times that of the transistor Tr1. The high level obtained at the output terminal Q shown in FIG. 6 is equal to or higher than 1.6 V, and the low level is equal to or lower than 0.8 V. If the current gain ratio of the transistor Tr1 is sufficient to drive a circuit of the next stage, it is possible to omit the emitter follower transistor Tr2.

As illustrated by the broken lines in FIG. 6, it is possible to provide a three-input exclusive-OR circuit by adding a transistor Tr3 and a load resistor $RL_{L1}$. The base of the transistor Tr3 is connected to the collector of the transistor Tr1, and the emitter thereof is connected to the power source $V_{EE}$. The collector of the transistor Tr3 is connected to an output terminal Q2, and coupled to the power source $V_{CC}$ via the load resistor $R_{L1}$. It is preferable that the transistor Tr3 be formed of a transistor having a type identical to that of the transistor Tr1.

It is also possible to replace the RHET which is a unipolar transistor by a resonant tunneling bipolar transistor (RBT) which has a negative differential conductance. For example, a RBT is disclosed in T. Futatsugi, et al., "A RESONANT-TUNNELING BIPOLAR TRANSISTOR (RBT)—A NEW FUNCTIONAL DEVICE WITH HIGH CURRENT GAIN", Japanese Journal of Applied Physics, Vo. 26, NO. 2, February, 1987, pp. L131-133. It is also possible to employ a diode having the negative differential conductance. However, a transistor having the negative differential conductance is superior to such a diode, because the resonance tunneling current $I_B$ passing from the base to the emitter is amplified, and output in the form of the collector current $I_C$. It is enough to form the resistors of elements functioning as resistors, such as transistors.

Figure 7A:
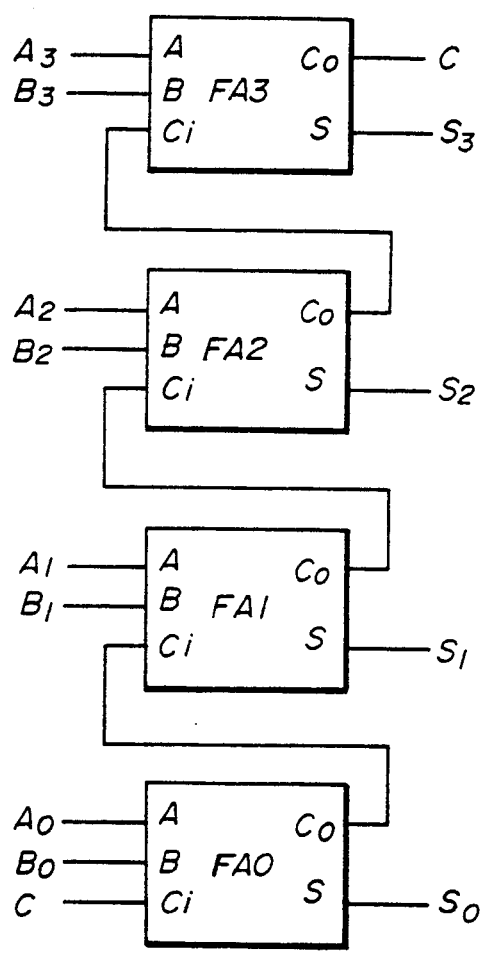
FIG. 7A is a block diagram of a four-bit full adder which is an application of the present invention.

FIG. 7A is a block diagram of a four-bit full adder, which has four full adders FA0, FA1, FA2 and FA3. Two input signals Ai and Bi (i=0, 1, 2, 3) input to the respective adders FAi. A carry bit C is input to the adder FA0, which outputs a sum signal S0 and a carry signal C0. The carry signal C0 is input to the adder FA1. In this way, the carry signal is propagated to the next-digit adder.

Figure 7B:
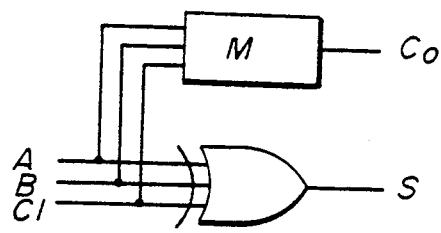
FIG. 7B is a block diagram of a full adder used in the adder shown in FIG. 7A.
Figure 8:
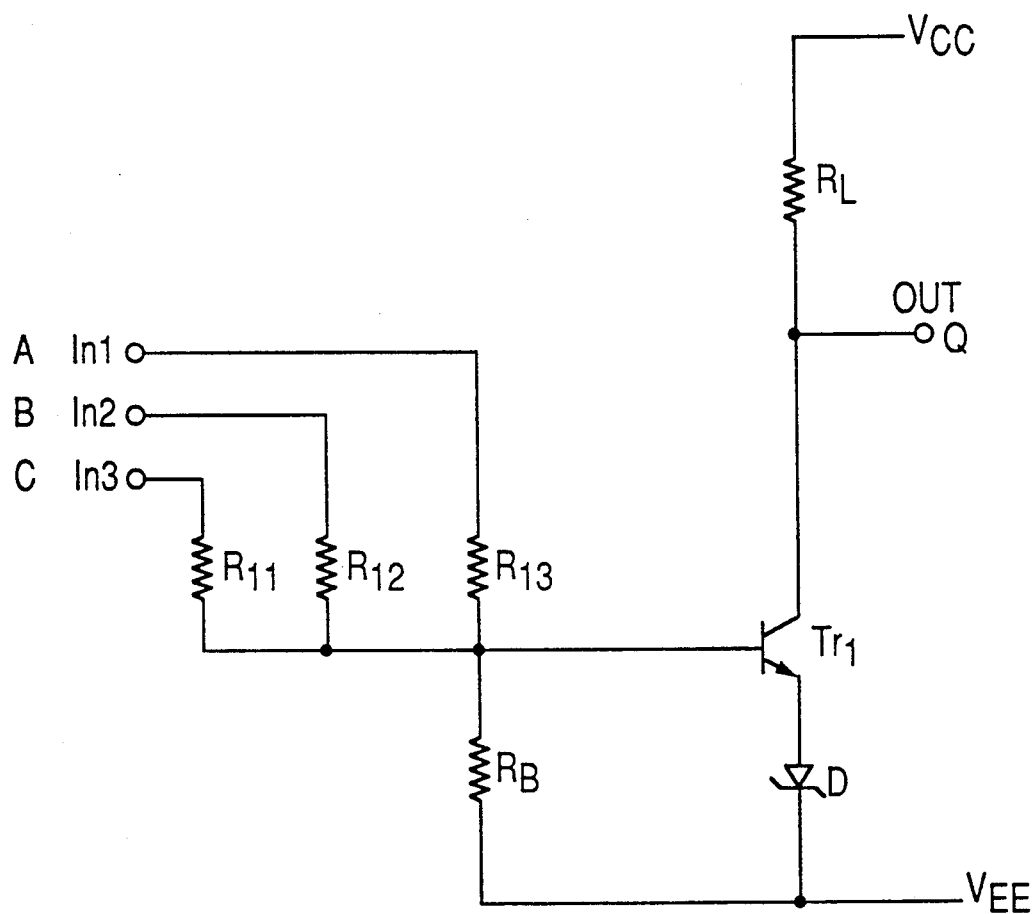
FIG. 8 is a circuit diagram showing another preferred embodiment utilizing a two-terminal negative differential element.

As shown in FIG. 7B, each of the adders FA0-FA3 is composed of a three-input exclusive NOR circuit (E-XOR) and a majority circuit (M). The three-input exclusive-NOR circuit is formed of the circuit according to the present invention. The majority circuit M is formed of a conventional circuit as disclosed in, for example, M. Suzuki et al., "GATE ARRAYS", 1988 IEEE International Solid-State Circuits Conference, ISSCC 88, Wednesday, Feb. 17, 1988, pp. 70-71.

Figure 1:
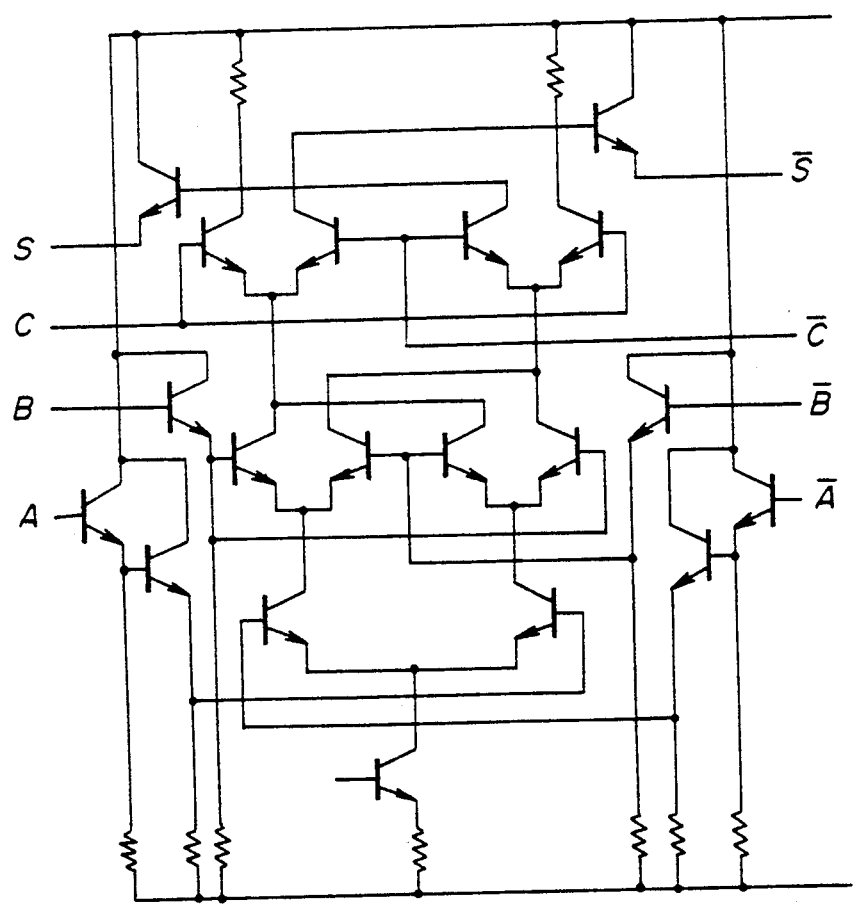
FIG. 1 is a circuit diagram of a conventional three-input exclusive-OR circuit.

When the four-bit full adder shown in FIG. 7A is configured by using the conventional three-input exclusive-NOR circuit shown in FIG. 1, 100 transistors and 29 resistors are needed. On the other hand, 20 transistors and 11 resistors are needed to configure the four-bit full adder shown in FIG. 7A according to the present invention. In addition, electrical power needed in the present invention is approximately one-tenth of that needed in the conventional circuit.

It is also possible to simply replace the RHET used in the aforementioned embodiments by an RBT disclosed in Japanese Laid-Open Patent Application No. 60-270803 (which corresponds to U.S. patent application Ser. No. 293,586 filed on Jan. 4, 1989). It is also possible to use a two-terminal element, such as a real space transfer device disclosed in, for example, Michael S. Shur et al., "New Negative Resistance Regime of Heterostructure Insulated Gate Transistor (HIGFET) Operation", IEEE Electron Device Lett. vol. EDL-17, p78, 1986. The two-terminal element is also formed of an Esaki diode disclosed in L. Esaki, "New Phenomenon in Narrow Germanium p-n Junctions", Phys. Rev. 109, p603, 1958, or a resonant-tunneling diode disclosed in L. L. Chang, et al., Appl. Phys. Lett. 24, p593, 1974. When using the two-terminal element, the RHET is replaced by a bipolar transistor or a field effect transistor. The two-terminal element is inserted between the emitter of the bipolar transistor and ground, or the source of the field effect transistor and ground.

The present invention is not limited to the specifically disclosed embodiments, and variations and modifications may be made without departing from the scope of the present invention.

What is claimed is:

1. A logic circuit comprising:
   first, second and third input terminals,
   an output terminal;
   a load resistance element;
   a transistor having an emitter, a base and a collector and having a negative differential conductance, said collector being connected to said output terminal and coupled to a first power source via said load resistance element, and said emitter being connected to a second power source;
   a first resistance element connected between the first input terminal and the base of said transistor;
   a second resistance element connected between the second input terminal and the base of said transistor;
   a third resistance element connected between the third input terminal and the base of said transistor; and
   a fourth resistance element connected between the base and emitter of said transistor,
   wherein resistance values of said first, second, third and fourth resistance elements are selected so that said transistor has first and second operating points respectively obtained when all the first, second and third input terminals are at a low level and when two of said first, second and third input terminals are at a high level, and has third and fourth operating points respectively obtained when one of said first, second and third input terminals is at the high level and when all the first, second and third input terminals are at the high level, and
   wherein a collector current obtained at said first and second operating points is less than that obtained at said third and fourth operating points.

2. A logic circuit as claimed in claim 1, wherein said transistor comprises a resonant-tunneling hot electron transistor.

3. A logic circuit as claimed in claim 1, wherein said transistor comprises a resonant-tunneling bipolar transistor.

4. A logic circuit as claimed in claim 1, wherein the resistance values of said first, second and third resistance elements are substantially equal to each other.

5. A logic circuit as claimed in claim 1, wherein said first, second, third and fourth resistance elements respectively comprises resistors.

6. A logic circuit as claimed in claim 1, further comprising driving means, provided between the collector of said transistor and said output terminal, for amplifying said collector current and for outputting an amplified current to said output terminal.

7. A logic circuit as claimed in claim 6, wherein said driving means comprises an emitter follower transistor having an emitter connected to said output terminal, a base connected to the collector of said transistor, and a collector connected to said first power source and connected to the base of said emitter follower transistor via said load resistance element.

8. A logic circuit as claimed in claim 7, wherein said emitter follower transistor is formed of a transistor having a type identical to that of said transistor having the negative differential conductance.

9. A logic circuit as claimed in claim 1, further comprising inverter means, provided between the collector of said transistor and said output terminal for inverting a voltage signal obtained at said output terminal and outputting an inverted version of said voltage signal to said output terminal.

10. A logic circuit as claimed in claim 9, wherein said inverter means comprises:
a fifth resistance element; and
an inverter transistor having a base connected to the collector of said transistor, an emitter connected to said second power source, and a collector coupled to said first power source via said fifth resistance element.

11. A logic circuit as claimed in claim 10, wherein said inverter transistor is formed of a transistor having a type identical to that of said transistor.

12. A logic circuit coupled to first and second power sources, comprising:
first, second and third input terminals;
an output terminal;
a load resistance element;
a transistor having first, second and third terminals, the first terminal of said transistor being connected to said output terminal and coupled to the first power source via said load resistance element;
a two-terminal element, having a negative differential conductance, connected between the third terminal of said transistor and the second power source;
a first resistance element connected between the first input terminal and the second terminal of said transistor;
a second resistance element connected between the second input terminal and the second terminal of said transistor;
a third resistance element connected between the third input terminal and the second terminal of said transistor, said first, second and third resistance elements having resistance values producing first and second operating points of said transistor and two-terminal element respectively obtained when all of said first, second and third input terminals are at a low level and when two of said first, second and third input terminals are at a high level, and producing third and fourth operating points of said transistor and said two-terminal element respectively obtained when one of said first, second and third input terminals are at a high level and when all of said first, second and third input terminals are at the high level, and producing a current passing through said transistor and said two-terminal element during operation at the first and second operating points which is less than the current produced during operation at the third and fourth operating points.

* * * * *

UNITED STATES PATENT AND TRADEMARK OFFICE
CERTIFICATE OF CORRECTION

PATENT NO. : 5,260,609
DATED : November 9, 1993
INVENTOR(S) : Motomu TAKATSU

It is certified that error appears in the above-indentified patent and that said Letters Patent is hereby corrected as shown below:

On title page, item [54] and col. 1, line 2, change "UISING" to --USING--.

Col. 1, line 35, the equation should read as follows: 

Col. 2, line 56, delete "the" (first occurrence).

Col. 5, line 28, change "$1_3$" (first occurrence) to --$1_1$--;
line 41, change "$R_B,$" to --$R_{B'}$--;

Col. 6, line 47, (col. 4, row 9 of the Table), change "15 nm." to --1.5 nm--.

Col. 7, line 25, change "$RL_1$" to --$R_{L1}$--.

Signed and Sealed this

Eighth Day of November, 1994

Attest:

Bruce Lehman

BRUCE LEHMAN

*Attesting Officer*    *Commissioner of Patents and Trademarks*